United States Patent
Sridharan et al.

(10) Patent No.: US 8,693,257 B2
(45) Date of Patent: Apr. 8, 2014

(54) DETERMINING OPTIMAL READ REFERENCE AND PROGRAMMING VOLTAGES FOR NON-VOLATILE MEMORY USING MUTUAL INFORMATION

(75) Inventors: Arvind Sridharan, Longmont, CO (US); Ara Patapoutian, Hopkinton, MA (US)

(73) Assignee: Seagate Technology LLC, Cupertino, CA (US)

( * ) Notice: Subject to any disclaimer, the term of this patent is extended or adjusted under 35 U.S.C. 154(b) by 269 days.

(21) Appl. No.: 13/275,598

(22) Filed: Oct. 18, 2011

(65) Prior Publication Data
US 2013/0094286 A1  Apr. 18, 2013

(51) Int. Cl.
*G11C 16/10* (2006.01)

(52) U.S. Cl.
USPC ..................................... 365/185.2

(58) Field of Classification Search
USPC ..................................... 365/185.2
See application file for complete search history.

(56) References Cited

U.S. PATENT DOCUMENTS

| | | | |
|---|---|---|---|
| 6,044,019 A | 3/2000 | Cernea et al. |
| 6,522,580 B2 | 2/2003 | Chen et al. |
| 7,023,735 B2 | 4/2006 | Ban et al. |
| 7,372,731 B2 | 5/2008 | Ban |
| 7,535,765 B2 | 5/2009 | Maayan |
| 7,558,109 B2 | 7/2009 | Brandman et al. |
| 7,593,259 B2 | 9/2009 | Kim |
| 7,663,914 B2 | 2/2010 | Lee |
| 7,890,818 B2 | 2/2011 | Kong et al. |
| 7,903,468 B2 | 3/2011 | Litsyn et al. |
| 7,944,757 B2 | 5/2011 | Moschiano et al. |
| 7,945,825 B2 | 5/2011 | Cohen et al. |
| 7,974,132 B2 | 7/2011 | Cornwell et al. |
| 7,990,764 B2 | 8/2011 | Alrod et al. |
| 8,000,135 B1 | 8/2011 | Perlmutter et al. |
| 8,000,141 B1 | 8/2011 | Shalvi et al. |
| 8,068,361 B2 | 11/2011 | Kang et al. |
| 8,077,520 B1 | 12/2011 | Yang et al. |
| 8,289,781 B2 | 10/2012 | Litsyn et al. |
| 8,331,169 B1 | 12/2012 | Yang et al. |
| 8,345,477 B1 | 1/2013 | Yang |

(Continued)

FOREIGN PATENT DOCUMENTS

| | | |
|---|---|---|
| WO | WO 2008078314 | 7/2008 |
| WO | WO 2011008367 | 1/2011 |
| WO | WO 2011094454 | 8/2011 |

OTHER PUBLICATIONS

Yaakobi et al., "Error Characterization and Coding Schemes for Flash Memories", GLOBECOM Workshops, 2010, IEEE, 5 pages.

(Continued)

*Primary Examiner* — Hoai V Ho
*Assistant Examiner* — Tri Hoang
(74) *Attorney, Agent, or Firm* — Hollingsworth Davis, LLC (57) ABSTRACT

Approaches for operating a memory device comprising memory cells are disclosed. Optimal values for one or more of programming voltages used to program memory cells of the memory device and read reference voltages used to read the memory cells are determined using a mutual information function, I(X; Y), where X represents data values programmed to the memory cells and Y represents data values read from the memory cells. The read reference and/or programming voltages used for reading and/or programming the memory cells are adjusted using the optimal values.

17 Claims, 8 Drawing Sheets

(56) References Cited

U.S. PATENT DOCUMENTS

| | | |
|---|---|---|
| 8,351,258 B1 | 1/2013 | Yang et al. |
| 8,363,501 B1 | 1/2013 | Ramamoorthy et al. |
| 8,369,141 B2 | 2/2013 | Sommer et al. |
| 8,386,890 B2 | 2/2013 | Wezelenburg et al. |
| 8,498,152 B2 | 7/2013 | Alrod et al. |
| 8,531,888 B2 | 9/2013 | Chilappagari et al. |
| 2006/0028875 A1 | 2/2006 | Avraham et al. |
| 2009/0287975 A1 | 11/2009 | Kim et al. |
| 2010/0118608 A1 | 5/2010 | Song et al. |
| 2010/0199149 A1 | 8/2010 | Weingarten et al. |
| 2011/0038212 A1 | 2/2011 | Uchikawa et al. |
| 2011/0066902 A1 | 3/2011 | Sharon et al. |
| 2011/0069521 A1 | 3/2011 | Elfadel et al. |
| 2011/0141827 A1 | 6/2011 | Mozak et al. |
| 2011/0182118 A1 | 7/2011 | Litsyn et al. |
| 2011/0216598 A1 | 9/2011 | Kim et al. |
| 2012/0008386 A1* | 1/2012 | Chilappagari et al. ..... 365/185.2 |
| 2012/0163085 A1* | 6/2012 | Alrod et al. .............. 365/185.18 |

OTHER PUBLICATIONS

U.S. Appl. No. 13/275,675, filed Oct. 18, 2011, Sridharan et al.
2008 Mielke et al., "Bit Error Ratein NAND Flash Memories", 46$^{th}$ Annual International Reliability Physics Symposium, Phoenix, 2008, pp. 9-19.
U.S. Appl. No. 13/275,418, filed Oct. 18, 2011, Patapoutian et al.
U.S. Appl. No. 13/275,497, filed Oct. 18, 2011, Sridharan et al.
Oct. 2, 2013, File History for U.S. Appl. No. 13/275,418, 103 pages.
Oct. 2, 2013, File History for U.S. Appl. No. 13/275,675, 125 pages.
Nov. 1, 2013, File History for U.S. Appl. No. 13/275,497, 254 pages.

* cited by examiner

DETERMINING OPTIMAL READ REFERENCE AND PROGRAMMING VOLTAGES FOR NON-VOLATILE MEMORY USING MUTUAL INFORMATION

SUMMARY

Some embodiments involve methods of operating a memory device comprising memory cells. Optimal values that provide predetermined bit error rate criteria for one or more of programming voltages used to program memory cells of the memory device and read reference voltages used to read the memory cells are determined using a mutual information function, $I(X;Y)$, where X represents data values programmed to the memory cells and Y represents data values read from the memory cells. The read reference and/or programming voltages used for reading and/or programming the memory cells are adjusted using the optimal values.

Some embodiments involve an apparatus comprising a controller configured to control a memory. The controller is configured to determine, using a mutual information function, $I(X;Y)$, optimal values for one or more of programming voltages used to program memory cells of the memory device and read reference voltages used to read the memory cells, where X represents data values programmed to the memory cells and Y represents data values read from the memory cells in the function $I(X;Y)$. The controller generates signals to control adjustment of at least one of the read reference voltages and the programming voltages to the optimal values.

These and other features and aspects of various embodiments may be understood in view of the following detailed discussion and accompanying drawings

DETAILED DESCRIPTION

Non-volatile memory devices are capable of retaining stored data for relatively long periods of time, even in the absence of external power. Non-volatile solid state memory includes flash memory which programs data into memory cells by applying a voltage causing charge to be stored on a floating gate of a transistor. The data can be later read from the memory cell by sensing the voltage of the transistor and comparing the sensed voltage to a read reference voltage. Flash memory technologies include NOR flash, NAND flash, 2D NAND flash, 3D NAND flash (also called vertical NAND (VNAND)) and various other technology types.

Memory cells are known to exhibit errors caused, for example, by charge leakage, manufacturing defects, disturb effects, etc. These errors may be manifested as bit errors in the decoded data. A memory device may use a number of measures to account for these errors, such as error correction codes (ECC), which utilize extra data for detecting and correcting bit errors. The memory device may generate a bit error rate (BER) signal based on ECC activity, and can use BER to analyze system performance.

The errors in data may be decreased by modifying the programming voltages used to program the data into the memory cells and/or by modifying the read reference voltages used to read data stored in the memory cells. Embodiments described in this disclosure involve methods and systems for determining appropriate read reference voltages and/or programming voltages for non-volatile solid state memory devices that reduce BER. In various implementations, the read reference voltages and/or programming voltages are determined using mutual information based methods. In probability theory, the mutual information of random variables is a value that measures the probabilistic mutual dependence of the random variables. Mutual information measures how much information one random variable provides about another random variable. Mutual information is a dimensionless quantity which may be expressed in units of bits.

Non-volatile memory devices may include single level cells (SLCs) that store one bit of data per cell or may include multi-level cells (MLCs) that can be programmed to store two or more bits of information. Reading data stored in SLCs involves distinguishing between two possible voltage levels. Reading data stored in MLCs involves distinguishing between more than two possible voltage levels. In general, a memory cell may be programmed to a predetermined number of voltages, M, where M can represent any of $2^m$ memory states. The value m is equal to the number of bits stored, and is greater than 1 for MLC memory. For example, memory cells programmable to four voltages can store two bits per cell (M=4, m=2); memory cells programmable to eight voltages have a storage capacity of three bits per cell (M=8, m=3), etc. While specific examples below are illustrated as two-bit-per-cell, it is not intended that the concepts and embodiments described herein be solely limited to this type of memory. For example, the techniques discussed herein are applicable to SLC device or to MLC devices capable of storing any number of bits per cell.

Figure 1:
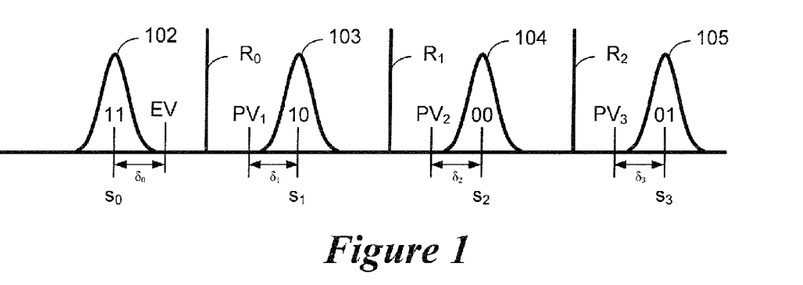
FIG. 1 provides an example of how data is stored a two-bit per cell memory device.

An example of how data is stored a two-bit per cell MLC device is shown in FIG. 1. When a memory cell is programmed, the cell is charged until the stored voltage value exceeds a program-verify voltage, $PV_1$, $PV_2$, $PV_3$. When the memory cells are erased, (erasure corresponds to the 11 state in FIG. 1), the memory cells are confirmed to be below an erase verify voltage, EV.

Assuming a Gaussian distribution, the actual stored voltages are distributed around target signal levels, $s_0$, $s_1$, $s_2$, and $s_3$ and fall within voltage distributions 102-105, respectively. Voltage distribution 102 includes the voltages stored in the memory cells corresponding to symbol 11, voltage distribution 103 includes the voltages stored in the memory cells corresponding to symbol 10, voltage distribution 104 includes the voltages stored in the memory cells corresponding to symbol 00, and voltage distribution 105 includes the voltages stored in the memory cells corresponding to symbol 01. Note that in the example of FIG. 1, the symbols are arranged along the voltage axis in a 11-10-00-01 arrangement, however, in some implementations, a 11-01-00-10 arrangement, or various other arrangements may be used.

Voltages $R_0$-$R_2$ are read reference voltages that are used to determine which symbols are stored in the cells. For example, after the voltage corresponding to the symbol 10 is applied to a cell during a program operation, the symbol 10 is said to be programmed into the cell. At a later time, the voltage of the cell is sensed and the sensed voltage is compared to one or more of the references voltages $R_0$, $R_1$, $R_2$, to determine the symbol stored in the cell. During a read operation, the sensed voltage may first be compared to $R_1$. If the comparison to $R_1$ determines that the sensed voltage is less than $R_1$, then the symbol stored in the cell is either 11 or 10. The sensed voltage may next be compared to $R_0$. If the sensed voltage is greater than $R_0$, then the symbol stored in the cell is 10. However, if the sensed voltage for this cell deviates from the voltage values associated with the symbol 10, e.g., the sensed voltage for the cell is instead greater than $R_1$ or less than $R_0$, then a bit error occurs when the cell is read.

As shown in FIG. 1, the separation $\delta_i$ between signal levels, $s_i$, and program verify voltages, $PV_i$ may be written:

$$\delta_i = s_i - PV_i, \text{ wherein } i=1, 2, 3 \quad [1]$$

In other words, $\delta_i$, is the separation between the target signal level $s_i$ for a symbol and the program verify level $PV_i$ for the symbol. Furthermore, $\delta_i$ is a function of the PE cycle, retention time, and read disturb, i.e. $\delta_i = \delta_i(PE, \tau, \rho)$. In general, the larger the noise or the leakage probability, the larger is $\delta_i$. This dependence can be measured and varies from one manufacturing process to another and from one technology to another. Note that once $\delta_i$ is known, $PV_i$ and $s_i$ are interchangeable. Similarly, in the erase state, $s_0 = EV - \delta_0$, where again $\delta_0 = \delta_0(PE, \tau, \rho)$.

The memory cells of a memory device can be grouped into data units referred to herein as data pages or blocks. A data page can correspond to a group of memory cells that are read at substantially the same time, for example. A group of memory pages that are erased at substantially the same time may be referred to as a block or erasure unit. Memory cells are programmed in units of pages and once programmed, the pages are not re-programmed until after the block of pages is erased. Garbage collection operations can be performed on the blocks of pages, wherein the blocks are erased after active data stored in each block is moved to another location. Thus, each memory cell of the memory device undergoes numerous program/erase (PE) cycles during the lifetime of the memory cell. In floating gate transistor memory cells, each PE cycle can degrade the cell, and after many PE cycles, lead to a decreased ability of the cell to retain data without substantial charge leakage.

It should be noted that in an arrangement such as shown in FIG. 1, the two bits in each cell need not be associated with the same page. For example, a memory system may be arranged so that the leftmost bit (most significant bit, or MSB) is associated with one page, and the rightmost bit (least significant bit, or LSB) is associated with another page. This arrangement may be referred to herein as "multipage." As discussed herein, full-sequence programming implies that each physical page of memory cells holds a single user page. Multipage programming implies that each physical page of the memory cells holds at least two user pages. For multipage programming of two bit memory devices, the pages corresponding to a physical page may be referred to as LSB and MSB pages.

In some implementations, the sensed voltages of the memory cells are compared to reference voltages in addition to $R_0$, $R_1$, and $R_2$. Comparison to the additional reference voltages may be used to generate soft information. Soft information can be used by some types of decoders, e.g., LDPC decoders, and provides a measure on the reliability of a bit being a "0" or a "1". The values obtained using the additional reference voltages are used to develop a log likelihood ratio (LLR). The LLR can be developed either analytically (based on a noise distribution) or more generally by a look up table.

According to various embodiments discussed herein, read reference voltages, $R_i$, program verify voltages, $PV_i$, and/or target signal levels, $s_i$, may be modified based on noise distributions associated with the cells. Modifying $R_i$, $PV_i$ and/or $s_i$ may be performed to decrease the BER, or to achieve a predetermined BER criteria, such as a relatively low average bit error rate for the pages, or a substantially equal bit error rate between certain types of pages, e.g., substantially equal BER for MSB and LSB pages of the memory device. The BER for the pages changes based on the number of PE cycles, retention time and disturb effects experienced by the pages. Modification of the programming and/or read reference voltages may be performed to mitigate errors caused by these effects. As denoted herein, $PV_i$ and $s_i$ are collectively referred to as programming voltages. This disclosure discusses mutual information based methods to adjust read reference and/or programming voltages. In the case of read reference voltages, these methods are also applicable when multiple read reference voltages for acquiring soft information are to be determined.

Figure 2:
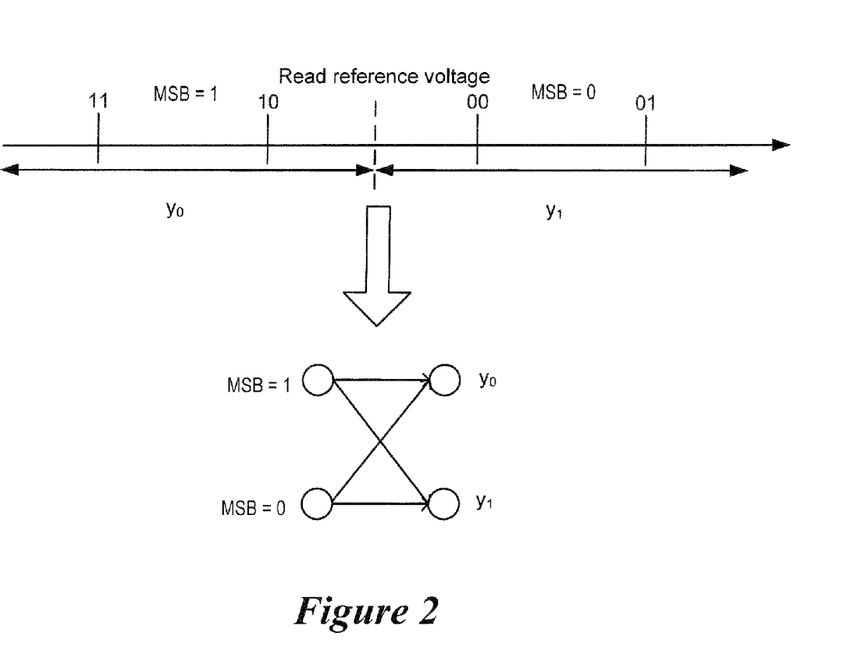
FIG. 2 shows the binary input binary output channel obtained for the most significant bit (MSB) of an M=4 flash cell with one read.

The approaches discussed herein are based on the observation that higher reliability for an error correcting code can be achieved on a channel with larger capacity than on one with a lower capacity. In general, larger capacity channels have larger signal to noise ratio (SNR), and the larger the SNR, the better the bit error rate. A channel is a statistical abstraction to characterize a system where there is transfer of information. For M level flash memory devices, a channel corresponding to the MSB or LSB has binary inputs 0 and 1. The output of the channel is the sensed voltage range of the MSB or LSB into which the read value falls. The number of outputs of the channel depends on the number of reads. FIG. 2 shows a channel corresponding to the MSB with one read. In the case of equally likely inputs, the maximum (over the conditional probabilities) of the mutual information $I(X; Y)$ between the input and output is referred to as the independent and uniformly distributed (i.u.d.) capacity. Thus, the aim is to choose the read reference and programming voltages that provide optimal, e.g., maximum, i.u.d. capacity.

The mutual information (in bits) between the input X and output Y of a channel, $I(X; Y)$ is defined as:

$$I(X; Y) = H(X) - H(X|Y) = H(Y) - H(Y|X) \quad [2]$$

wherein $H(X)$ and $H(Y)$ are binary entropy functions and $H(X|Y)$ and $H(Y|X)$ are conditional entropy functions. The entropy functions, H(X) and H(Y) provide a measure of the uncertainty about X and Y, respectively. In general, the higher the entropy, the more uncertainty about X or Y. The conditional entropy functions H(X|Y) and H(Y|X) express the average uncertainty about X after observing Y and the average uncertainty about Y after observing X, respectively. H(X) and H(X|Y) may be mathematically defined as:

$$H(X) = -\Sigma p(x) \log_2 p(x) \quad [3]$$

$$H(X|Y) = -\Sigma p(x, y) \log_2 p(x|y) \quad [4]$$

In case of a K-ary discrete input (i.e., K possible inputs) discrete output channel where the inputs are equally likely I(X; Y) may be written:

$$I(X; Y) = \log_2 K - \left(\frac{1}{K}\right) \Sigma_y p(y \mid x) \log_2\left(\frac{p(y \mid x)}{\Sigma_z p(y \mid z)}\right), \quad [5]$$

where z in Equation 5 is an intermediate summation variable for x. Note that maximizing mutual information in some implementations is equivalent to minimizing the conditional entropy, H(X|Y).

An approach for choosing read reference voltages is described below for the multipage programming case. In this case, a single programmed (written) bit has to be recovered. In an M=4 MLC flash, two bits are combined to obtain four possible program levels. The bits are recovered by one or more reads using appropriate reference voltages. The methods described herein can be used for any such read(s). FIG. 2 shows the binary input binary output channel obtained from an M=4 flash when the aim is to recover the MSB with only one read. In FIG. 2, $y_0$ denotes the event that the read value falls to the left of the read reference voltage and $y_1$ denotes the event that the read value falls to the right of the read reference voltage. As illustrated in the lower portion of FIG. 2, if the MSB was programmed as a "1" (MSB=1) the possible outcomes of a read operation would be $y_0$, (correct), or $y_1$, (error). Similarly, if the MSB was programmed as a "0" (MSB=0) the possible outcomes of a read operation would be $y_0$, (error), or $y_1$, (correct).

Figure 3:
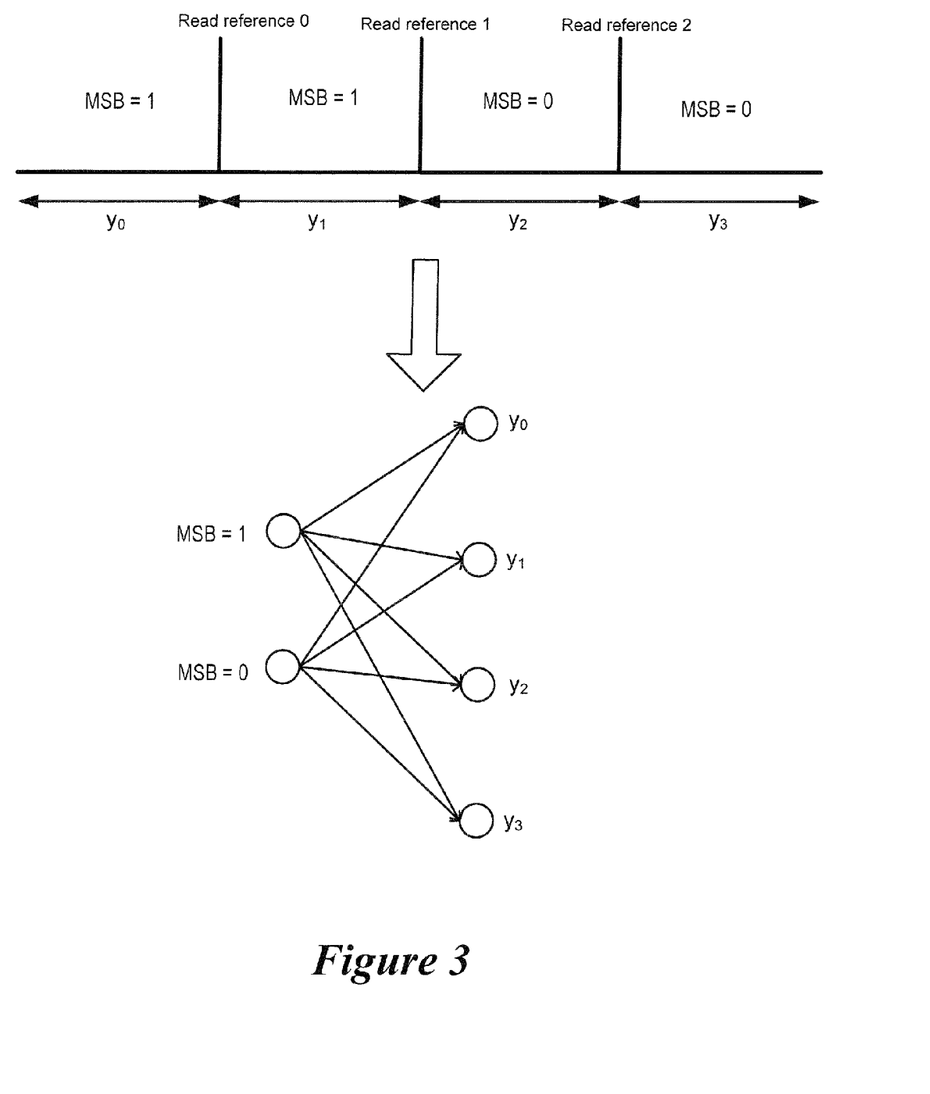
FIG. 3 illustrates a binary input quaternary output channel for the case with three read reference voltages.

FIG. 3 illustrates a binary input quaternary output channel for the case with three read reference voltages In the upper portion of FIG. 3, $y_0$ refers to the event that the read value falls to the left of read reference 0, $y_1$ refers to the event that the read value falls between reference 0 and reference 1, $y_2$ refers to the event that the read value falls between reference 1 and reference 2, and $y_3$ refers to the event that the read value falls to the right of reference 2. As illustrated in the lower portion of FIG. 3, in this illustrative example, if the MSB was programmed as a "1" (MSB=1), the possible outcomes of a read operation would be $y_0$, (correct), $y_1$, (correct), $y_2$, (error), $y_3$, (error). Similarly, if the MSB was programmed as a "0" (MSB=0) the possible outcomes of a read operation would be $y_0$, (error), $y_1$, (error), $y_2$, (correct), $y_3$, (correct). In general, with t read references and a binary input, the binary channel has t+1 possible outcomes. Embodiments discussed below use the mutual information between the inputs x and outputs y to determine optimal placement of the read reference voltages.

A real valued function, f, is called a convex function if and only if the graph of the function lies below the line segment joining any two points of the graph. This is captured by the Equation 5:

$$f((tx+(1-g)y)) \leq tf(x)+(1-t)f(y) \quad [6]$$

In Equation 6, x and y are two points in the domain of definition of f (x and y can be elements of a vector space in general) and t is a number between 0 and 1. Mutual information I(X; Y) is a convex function of the transition probability p(y|x) for equally likely input symbols. The transition probability p(y|x) is the probability that output y will occur given input x has occurred. The transition probabilities p(y|x) are dependent on the noise characteristics of the channel.

The notion of convex functions is useful because various techniques can be used to determine extremal points of convex functions. Examples of convex optimization techniques are gradient descent, steepest descent, Newton step, interior point methods. Any of these optimization techniques can be used to maximize I(X; Y) for a fixed p(x).

Figure 4:
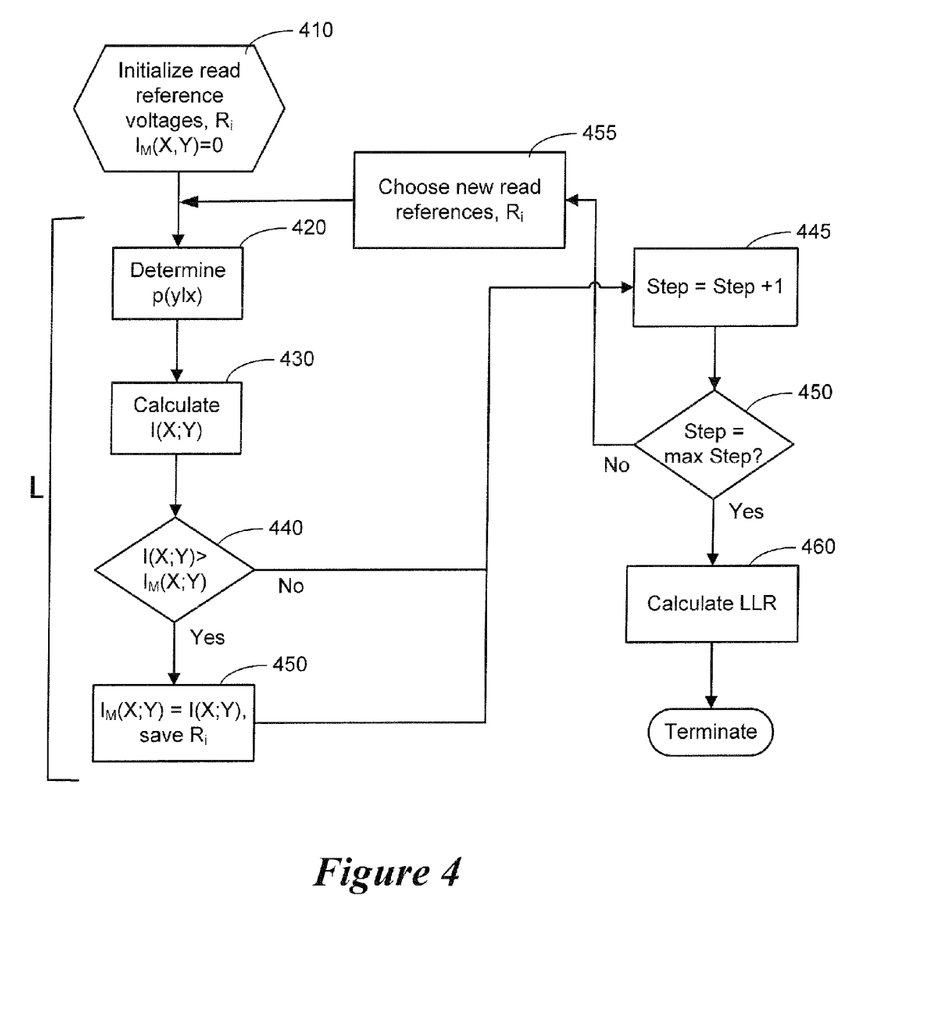
FIG. 4 shows a flow diagram describing an iterative process of determining read reference voltages and corresponding soft data for multipage programming in accordance with example embodiments.

FIG. 4 shows a flow diagram describing an iterative process of determining read reference voltages and corresponding soft data for multipage programming. Soft data provides both an estimate of the stored binary value along with a reliability indicator. For example, multiple reads may be used in order to obtain higher resolution in soft information. In such a case, multiple read references may need to be optimized. Soft data can be expressed as a log likelihood ratio (LLR). The LLR for a received value, y can be written:

$$L(y) = \log\left(\frac{P(y \mid x = 0)}{P(y \mid x = 1)}\right). \quad [7]$$

where P(y|x=0)) is the probability that the read value is y if the stored value was x=0 and P(y|x=1) is the probability that the read value is y if the stored value was x=1. The LLR for each bit may be expressed in terms of a signed number. For example, the signed numbers can range from +10 to −10. The sign of the number represents the likely state of the bit given the read value, with a positive sign representing the logic state 0 and a negative sign representing the logic state 1. The magnitude of the number represents the degree of confidence in the estimated logic state. For example, a +1 can indicate that the bit is estimated to be a logic zero, but confidence is low. A +5 can indicate that the bit is estimated to be a logic zero and a +10 can represent that the bit is estimated to be logic zero with high confidence. A −4 indicates that the bit is probably a logic one.

According to the process of FIG. 4, the read reference voltages, $R_i$, are initialized 410. The maximum value of the mutual information, $I_M(X; Y)$, is initialized to 0. At block 420, the transition probability p(y|x) is obtained. Transition probabilities can be determined from the noise statistics. Various approaches may be used to obtain noise statistics. For example, in some implementations, noise statistics may be determined by reading, at any opportune time, e.g., during a garbage collection operation, training data stored in the memory cells. The training data may be obtained from a known data pattern or may be obtained from ECC converged data. In some cases, the training data may have a lower code rate to increase the likelihood of convergence. In some implementations, determination of noise statistics may be based on bucket classification of errors as described in commonly owned and concurrently filed U.S. patent application Ser. No. 13/275,418 which is incorporated herein by reference in its entirety. In some implementations, error counts for each choice of read reference voltage may be determined and used to empirically estimate p(y|x).

At block 430, the mutual information between the input x and output y, I(X; Y), is calculated. In some configurations, it is possible to instead calculate conditional entropy, $H(X|Y)$. If conditional entropy is used, the read reference voltages are chosen to minimize $H(X|Y)$.

The mutual information $I(X; Y)$ for this iteration is compared to the current maximum value, $I_M(X; Y)$. If the mutual information, $I(X; Y)$, obtained for the current reference voltages, $R_i$, is greater than 440 the current mutual information maximum value, $I_M(X; Y)$ then the maximum mutual information value is set equal 450 to the mutual information obtained at this iteration. The read references for this iteration step, $R_i$, are saved 450 and the process proceeds 445 to the next step.

If the mutual information, $I(X; Y)$, obtained for the current reference voltages, $R_i$ are less than or equal to 440 the current maximum mutual information value, $I_M(X; Y)$ then the process proceeds 445 to the next iteration step. If the next step is not the maximum step, then the next read reference voltages are chosen 455 and loop L is performed again using the next read reference voltages.

Convex optimization techniques have well defined ways to direct the search for the point at which the objective function attains its maximum (or minimum) value. Thus, the read reference voltages can be chosen based on the particular optimization technique being used. Often only a limited set of read reference voltages are possible in the system. If so, the process steps through the possible choices. In some cases, there is some a priori information about the noise statistics, and the read reference voltages tested can be predetermined based on the a priori information. In these cases it is sufficient to only check read reference voltages around the predetermined optimal point.

If there are no more read reference voltages to be tested, then the LLR associated with the received value y is calculated 460 using the transition probabilities and Equation 7. Note that it may be necessary to further quantize the LLR depending on the number of bits available to store the LLR. It is possible that the read reference voltages do not change (either as a result of the optimization procedure or by choice) but even in this case the associated LLR's can be determined as illustrated in FIG. 4.

A similar method of maximizing mutual information between input and output also works for optimizing read reference voltages for full sequence programming. The main difference is that for the full sequence programming case, there are M input levels (M at least 2).

In some implementations, optimal programming voltages, e.g., target signal levels, $s_i$, and/or program verify voltage, $PV_i$, can also be determined using mutual information. The underlying idea behind determining optimal programming voltages is once again to maximize mutual information between input and output. This process may be more complicated than adapting read reference voltages. One reason is that the noise statistics are computed during a read operation and therefore at a value of P/E cycles, retention, read disturb etc., that do not always correspond to the conditions under which the programming is performed. This discrepancy in the time the parameters of the noise distribution are determined may be addressed by extrapolating the collected information from a first time/condition to the time/condition of interest. In some cases, the extrapolation may be based on a charge leakage model that takes into account, various factors such as BER of the page, PE cycles, retention time, potential disturb events, type of page being written to, page number being written to, among other factors.

Another reason for the additional complexity in determining programming voltages is that in multipage architecture there are multiple binary input channels that need be considered to determine if and how much the program verify voltages need to be modified to achieve optimal values. Note that in the example below, the signal levels, $s_i$, for the symbols are determined. Once the signal levels are determined, then the program verify voltages, $PV_i$, can be calculated using Equation 1.

Figure 5:
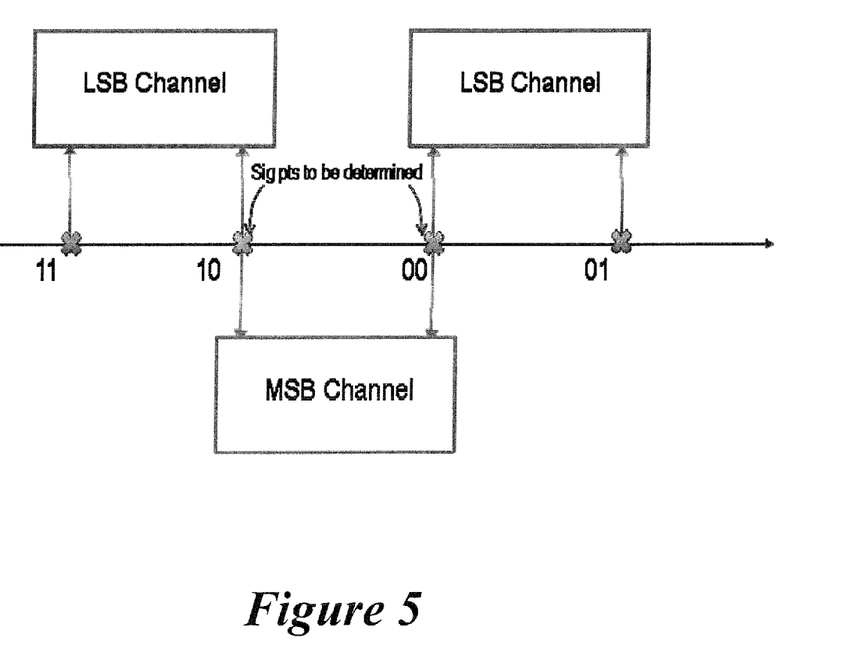
FIG. 5 shows an M=4 memory cell illustrated as a most significant bit (MSB) channel and two least significant bit (LSB) channels for which optimal programming voltages may be determined in accordance with example embodiments.

Using the M=4 memory cells as an example, there is an MSB channel formed by dividing the signal points into two groups, one group with MSB=0 and the other with MSB=1. There are two LSB channels, each LSB channel having signal points divided into two groups, one group with LSB=0 and the other with LSB=1. The MSB and LSB channels are illustrated in FIG. 5. Here, it is assumed that each channel is defined by just two signal levels, one from each group, that are closest to each other. Typically the signal levels are to be chosen so that the MSB channel and the two LSB channels have the same $I(X; Y)$. This presents a constrained optimization problem. In several cases of interest the optimization problem is a convex optimization problem and several techniques are available for solving it. Determination of optimal signal levels, $s_i$, is similar to the technique discussed for determining optimal read reference voltages (see FIG. 4).

Figure 6:
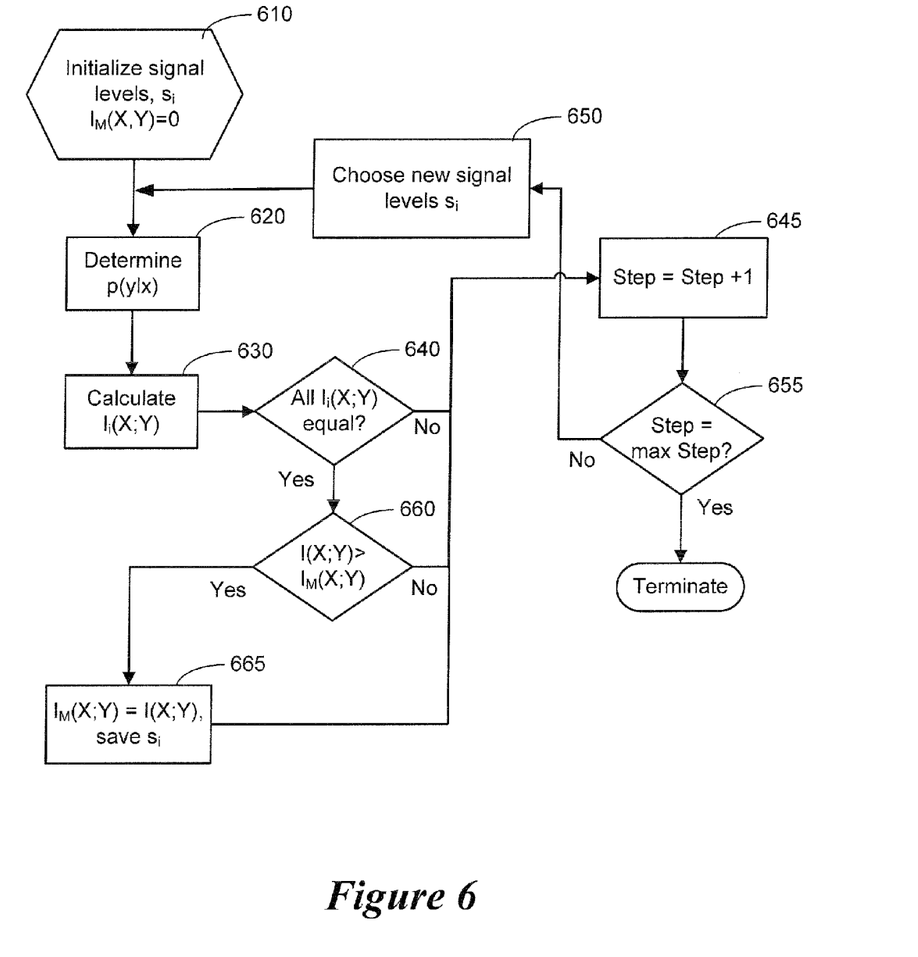
FIG. 6 is a flow diagram illustrating a process for determining optimal signal levels, $s_i$ using mutual information in accordance with embodiments described herein.

FIG. 6 is a flow diagram illustrating a process for determining optimal signal levels, $s_i$, using mutual information. According to the process of FIG. 6, the signal levels, $s_i$, are initialized 610. The maximum value of the mutual information, $I_M(X; Y)$, is initialized to 0. At block 620, the transition probabilities $p|x)$ are obtained. Transition probabilities for each choice of target signal levels, $s_i$, are determined. The transition probabilities can be determined from the noise distribution. Approaches for estimating parameters of the noise distribution include, for example, using training data and/or using bucket classification of errors and/or using other techniques. One difference between the process for determining optimal read reference voltages (see, e.g., FIG. 4) and the process for determining optimal signal levels is the output of the channel can be modeled as a continuous output (see FIG. 7A)

Figure 7A:
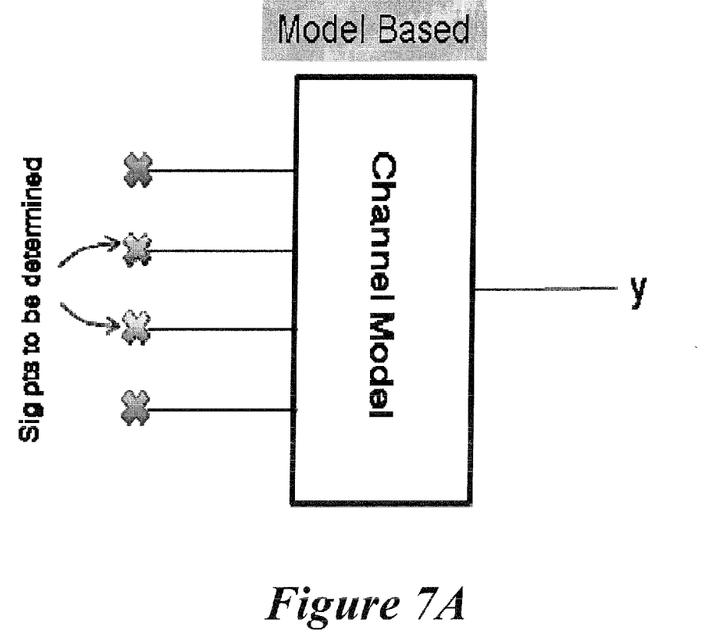
FIG. 7A illustrates an M=4 memory cell modeled as a continuous channel.
Figure 7B:
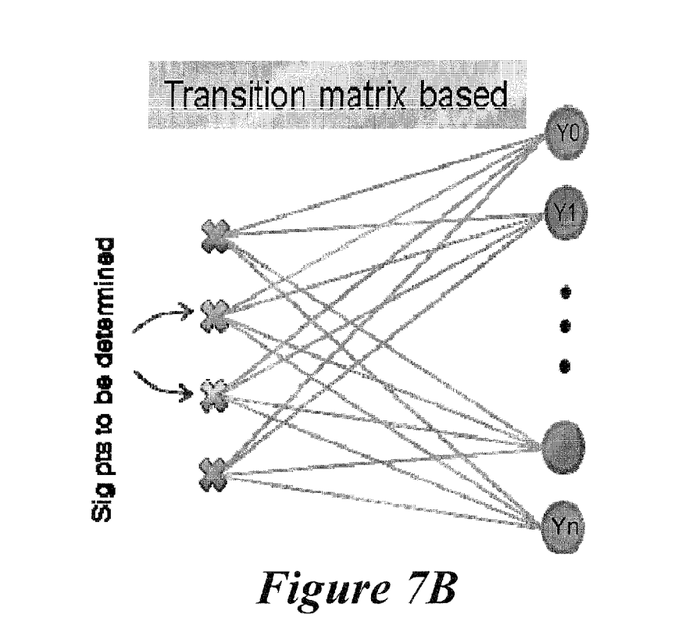
FIG. 7B illustrates an M=4 memory cell modeled as a transition matrix.

Rather than use a continuous output channel, as illustrated in FIG. 7A, alternatively, a quantized version of the continuous output channel (see FIG. 7B) can be used to obtain a transition matrix based channel model. It will be appreciated that the finer the quantization the better the results. If the output is modeled as a continuous output channel, then y in FIG. 7A, may take on any value. However, in the quantized version, as illustrated in FIG. 7B, the output may only take on discrete values $Y_0-Y_n$ in as illustrated in FIG. 7B.

At block 630, the mutual information between the input and output, $I_i(X; Y)$, is calculated 630 for each channel, e.g., MSB and LSB channels, and current choice of signal levels, $s_i$. In some cases, it is convenient to use an alternate expression for $I(X;Y)$, $I(X;Y)=H(Y)-H(Y|X)$ if the output is treated as a continuous output channel. In this case, $H(Y|X)$ is a constant and $H(Y)$ may be expressed using an expression similar to the equation for $H(X)$ (Equation 3 above) with y substituted for x except that an integral is used instead of a summation since Y is continuous. For a given noise model (assumed to be additive), $H(Y|X)$ is fixed and maximizing $I(X;Y)$ is equivalent to maximizing $H(Y)$. As earlier, it is also possible to instead calculate $H(X|Y)$, in which case the signal levels would be chosen to minimize $H(X|Y)$.

In some implementations, the process determines 640 whether the mutual information values, $I_i(H; Y)$, for each of the signal levels, $s_i$, are equal. In this implementation, if the mutual information values, for each of the signal levels are equal, then the mutual information value, $I_i(X; Y)$, is compared 660 to the current maximum value, $I_M(X; Y)$. If the mutual information value $I_i(X;Y)$, is greater than the current maximum value, $I_M(X;Y)$, then the current maximum value, $I_M(X;Y)$, is replaced 665 by the mutual information value determined for this iteration, $I_i(X;Y)$. Signal levels, $s_i$, for this iteration are saved 665 as potential optimal values. If the mutual information values, $I_i(X;Y)$, determined for this iteration are not equal 640, or if the mutual information values $I_i(X;Y)$, determined for this iteration are equal 640, but are not greater than 660 the current maximum value of the mutual information, $I_M(X;Y)$, then the process proceeds to the next iteration step 645. If the max step has not yet been reached 655, then a different set of signal levels, $s_i$ is selected 650. At the termination of the process, the optimal signal levels may be used to calculate the optimal program verify voltages. The signal levels and/or program verify voltages may be used to program the memory cells.

In some cases, box 640 may be omitted or may include a different conditional process. In these cases, the mutual information values for each of the signal levels may not be constrained to all be equal as depicted in box 640. In some implementations, the mutual information values for some of the signal levels, e.g., the LSB levels, may be constrained to be equal and the mutual information values of other signal levels may not be so constrained. In some implementations, the sum of the mutual information values for the signal levels is maximized. In some implementations, the mutual information values for each of the signal levels may be constrained to be above a predetermined level. In each of these implementations, the mutual information values for each of the signal levels may or may not be constrained to be equal.

For example, in some scenarios, the process illustrated in FIG. 6 may substitute the process of block 640 with the conditional $\Sigma_i I_i(X;Y)=$Max value?. In this scenario, if the sum of the mutual information for the signal levels is maximum, then the process proceeds to box 660. If the sum of the mutual information for the signal levels is not maximum, then the process proceeds to the next iteration 645.

In case convex optimization techniques are used the choice of the signal levels, $s_i$, for each iteration step is directed by the particular convex optimization procedure being used. Alternatively, the process can assess each of the available signal level choices. If there is some a priori information regarding the availability or desirability of certain signal levels, the available choices for the signal levels, $s_i$, can be predetermined based on the a priori information. In this scenario, it may be sufficient to investigate signal levels around the predetermined point, e.g. a point that is indicated by the a priori information as being potentially optimal.

As previously mentioned, it is possible to choose the signal levels without the constraint that the mutual information be the same for all channels. This may be of interest for systems where different error correcting codes (ECC) and/or code rates for the ECC are used for the MSB and LSB channels. The process without the constraint that the mutual information be the same for all channels is similar to that described in FIG. 6, although the conditional step 640 is not needed. Further, the mutual information for all three channels are tracked. In the case of full sequence programming only one M input channel rather than multiple binary input channels needs to be considered. Otherwise the optimization procedure is similar to that described above. Another option is to maximize the sum of the mutual information of the LSB and MSB channels without the constraint that they be equal.

The procedure described above and illustrated in FIG. 6 for choosing target signal levels may be performed independently of the process for choosing the read reference levels. Implementation of the independent processes illustrated by the flow diagrams of FIGS. 4 and 6 may be widely applicable since it is not known a priori how many reads will be used to determine the read reference voltages. In cases where a specified number of reads is always used, the programming voltages and read reference voltages can be jointly determined by an iterative procedure. A method of jointly determining the programming voltages and read reference voltages is described by FIG. 8. Initialization involves initializing 810 the read reference voltages, $R_i$, and signal levels, $s_i$, and setting the maximum mutual information value, $I_M(X;Y)$, to 0. The optimal read reference voltages are determined 820 using the process previously described in FIG. 4 and are set to their optimal values. Note that, the signal levels, $s_i$, may be fixed during the portion of the process that determines the read reference voltages. Thus transition probabilities are a function of the read reference voltages.

Figure 8:
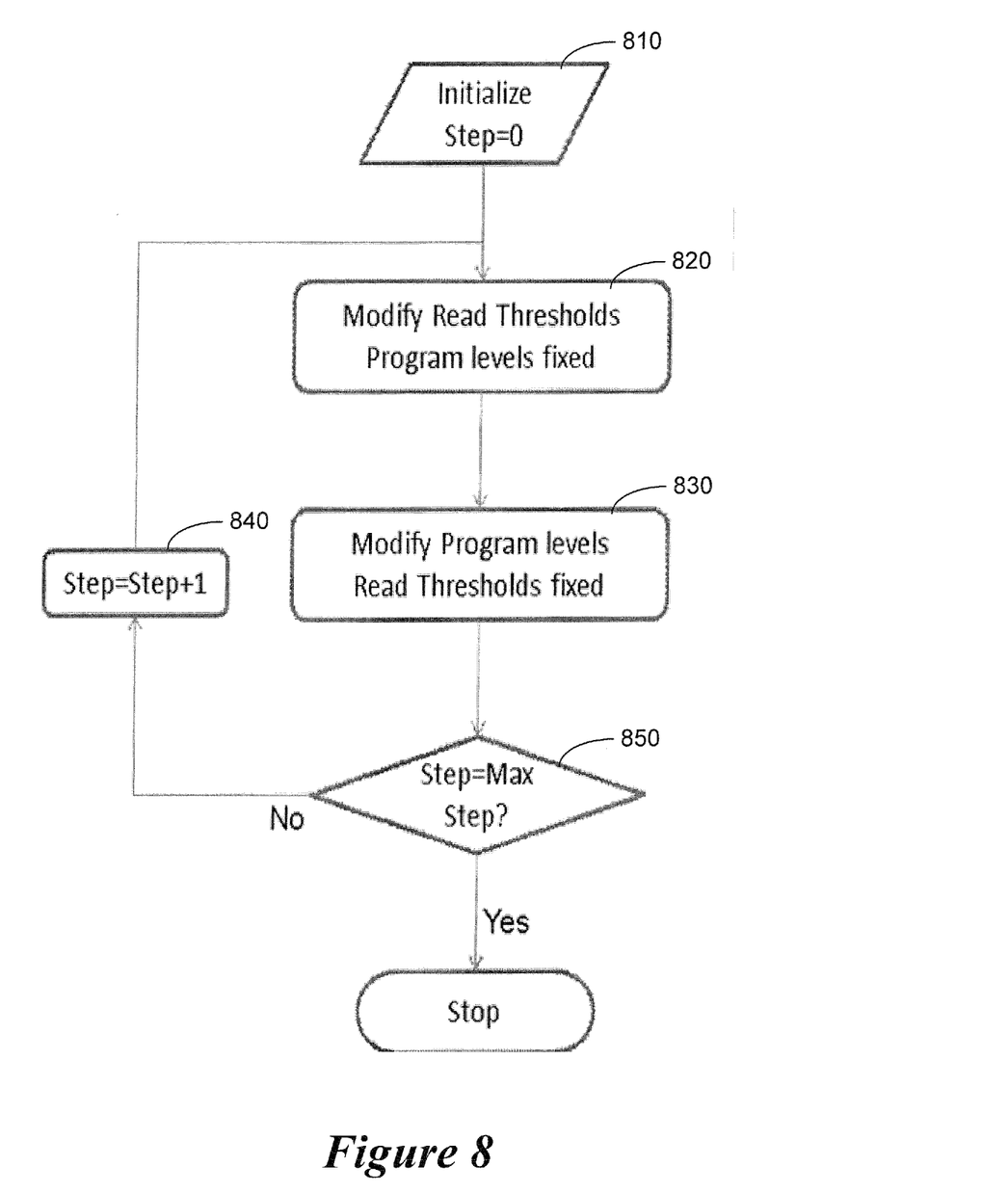
FIG. 8 is a flow diagram illustrating a process for jointly determining optimal read reference voltages and programming voltages.

At block 830, the optimal signal levels, $s_i$, are determined using the process previously described with reference to FIG. 6. In this case the number of outputs of the binary input channel(s) (M-ary input channels in the case of full sequence programming) is determined by the number of read reference levels. Further, the read reference levels are fixed in the process for determining the signal levels, and the transition probabilities are only a function of the signal levels. The process continues iteratively 840 until a maximum iteration step is reached 850.

Figure 9:
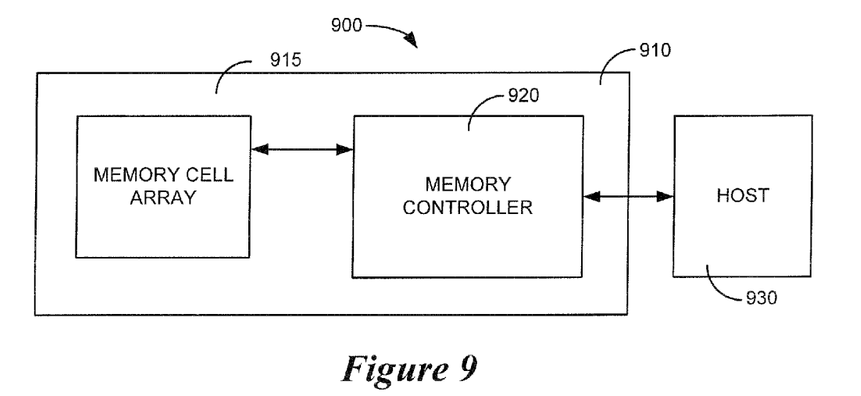
FIG. 9 is a block diagram of a system capable of storing data in memory cells and later retrieving the data including adjusting one or more of programming and reference voltages using a mutual information based approach according to approaches described herein.

FIG. 9 is a block diagram of a system 900 capable of storing data in memory cells and later retrieving the data including adjusting one or more of $s_i$, $PV_i$, and $R_i$ using a mutual information based approach according to approaches described herein. The system 900 includes a memory device 910 which may be coupled for communication with a host processor 930. The memory device 910 comprises a memory cell array 915 and a memory controller 920. The memory controller 920 is configured to control the operation of the memory array 915 and to provide an interface between the memory array 915 and the host 930. The block diagram of FIG. 9 and other block diagrams discussed herein show system components divided into functional blocks. It will be appreciated by those skilled in the art that there exist many possible configurations in which these functional blocks can be arranged and implemented. The examples depicted herein provide some possible functional arrangements for system components. For example, in some implementations, all or a portion of the functionality of the memory controller 920 may be included within the host 930. The various approaches described herein may be implemented using hardware, software, or a combination of hardware and software, for example.

The data stored in each memory cell of the memory array 915 is represented as an analog voltage according to the amount of charge stored in the memory cell. As discussed in more detail herein, the analog voltages of each memory cell can be converted to a digital format corresponding to a symbol comprising one or more data bits stored in the memory cell. Programming data to a memory cell involves a sequence of steps that include charging the memory cell and verifying whether the memory cell is sufficiently charged so that the analog voltage of the memory cell has surpassed a program verify voltage ($PV_i$) corresponding to the data symbol to be stored. Reading the data stored in the memory cell involves sensing the analog voltage of the memory cell and comparing the sensed analog voltage to one or more read reference voltages.

The memory array 915 comprises detector circuitry including voltage sense and comparator circuitry configured to sense the analog voltages of the memory cells of the memory array 915 to effect read operations. The detector circuitry compares the sensed voltages of the memory cells to reference voltages and outputs an indication of the digital symbols stored in the memory cells based on the comparisons. The memory array 915 also includes write circuitry configured to generate signals to implement programming operations of the memory 915.

Figure 10:
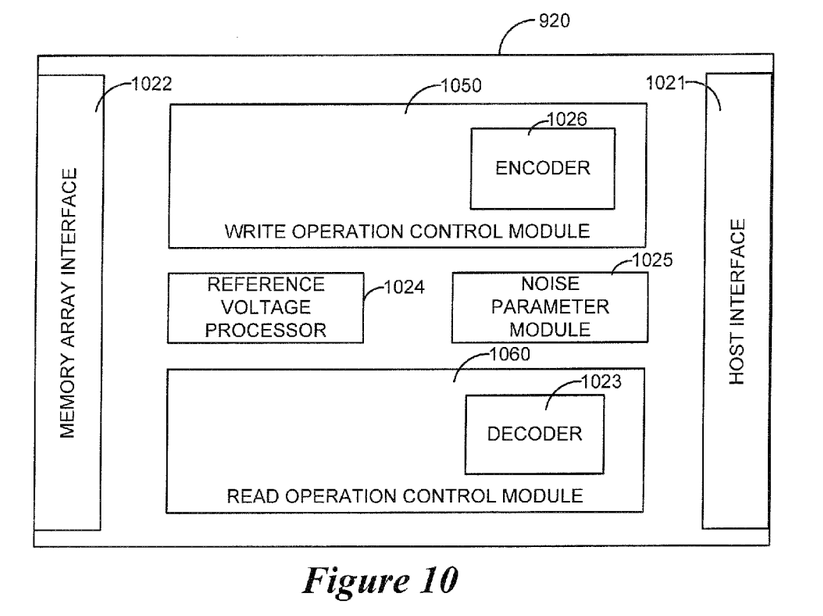
FIG. 10 provides a more detailed view of the controller of FIG. 9 in accordance with embodiments discussed herein.

FIG. 10 illustrates the memory controller 920 in more detail. A host interface 1921 facilitates the transfer of data and control signals between the memory controller 920 and the host 930. A write operation control module 1050 controls certain write operations involving transfer of data from the host 1230 through the memory controller 920 and then to the memory 915 for storage. Prior to storage of the data in memory 915, the data may be encoded by the encoder circuitry 1026 using an error correcting code (ECC). The encoded data is then transferred via the memory array interface 1022 from the controller 920 to the memory 915 and is programmed into the memory cells of the memory 915.

A read operation control module 1060 controls certain read operations involving the transfer of data from the memory 915 through the memory controller 920 and then to the host 930. For example, if the host 930 requests retrieval of the stored data in the memory 915, the read operation control module generates signals that control retrieval of the encoded data from the memory array 915. After the data is read from the memory 915, the data is decoded by decoder circuitry 1023 using the ECC. The decoded data is transferred to the host 930 via the host interface 1021. The decoder 1023 uses the ECC to attempt to identify and/or correct errors that are present in the data read from the memory 915. The data errors may arise, for example, due to data corruption caused by charge leakage and/or disturb effects as mentioned above.

The controller 920 includes a reference voltage processor 1024 which may be configured to implement various processes related to determining reference voltages used to read and/or programming voltages used to program the memory 915 using mutual information-based techniques as described herein. The reference voltage process may use information obtained by a noise parameter module 1025. The noise parameter module 1025 may be configured to determine noise statistics for some arbitrary PE cycle number, retention time, $\tau$, read disturb, type of page, e.g., MSB or LSB, page number, and/or other parameters. In some implementations, the noise parameter module may determine the noise statistics from training data stored in the memory 915. In some implementations, the noise parameter module obtains the noise statistics from a bucket classification of errors as described in previously incorporated U.S. Publication No. 2013/0094288.

In various embodiments, the reference processor 1024 may be configured to determine read reference and/or programming voltages using mutual information-based techniques. For example, the reference processor 1024 may implement one or more of the mutual information-based processes illustrated and/or described above with reference to the process flow diagrams or FIGS. 4, 6, and/or 8 to determine read reference and/or programming voltages.

In some cases, the noise distributions used to estimate the channel noise may be symmetrical or asymmetrical. The parameters of the symmetrical asymmetrical distributions, e.g., standard deviation for a Gaussian noise, may be determined using the bucket classification of errors as described above. The mutual information-based approach discussed herein can be used to determine the optimal programming voltages and/or read reference voltages for the asymmetrical noise distributions. The use of asymmetrical noise distributions is more fully described in concurrently filed U.S. patent application Ser. No. 13/275, 497 which is incorporated here by reference in its entirety.

The various embodiments described above may be implemented using circuitry and/or software modules that interact to provide particular results. One of skill in the computing arts can readily implement such described functionality, either at a modular level or as a whole, using knowledge generally known in the art. The structures and procedures shown above are only a representative example of embodiments that can be used to facilitate managing errors in flash memory as described above.

The foregoing description of the example embodiments has been presented for the purposes of illustration and description. It is not intended to be exhaustive or to limit the inventive concepts to the precise form disclosed. Many modifications and variations are possible in light of the above teaching. Any or all features of the disclosed embodiments can be applied individually or in any combination are not meant to be limiting, but purely illustrative. It is intended that the scope be limited not with this detailed description, but rather determined by the claims appended hereto.

What is claimed is:

1. A method of operating a memory device, comprising:
jointly determining, using a mutual information function, $I(X; Y)$, optimal values that provide predetermined bit error rate criteria for one or more of programming voltages used to program memory cells of the memory device and read reference voltages used to read the memory cells, where X represents data values programmed to the memory cells and Y represents data values read from the memory cells in the function $I(X; Y)$, wherein the optimal values for one of the read reference voltages and programming voltages are determined while holding the other of the read reference voltages and programming voltages fixed; and
adjusting at least one of the read reference voltages and the programming voltages using the optimal values.

2. The method of claim 1, wherein determining optimal values comprises determining optimal values for the programming voltages.

3. The method of claim 2, wherein determining optimal values comprises determining the mutual information for each of a plurality of input/output channels, wherein each of the channels are constrained to have the same mutual information value.

4. The method of claim 2, wherein determining optimal values comprises determining the mutual information for each of a plurality of input/output channels, wherein the channels are not constrained to have the same mutual information value.

5. The method of claim 2, wherein determining the optimal programming voltages comprises determining mutual information for a channel that has M levels, wherein M is a number of possible voltage levels that can be stored in the memory cells and M is greater than 2.

6. The method of claim 1, wherein determining optimal values comprises determining optimal values of the read reference voltages.

7. The method of claim 6, wherein determining the optimal read reference voltages comprises determining mutual information for a channel that has M levels, wherein M is a number of possible voltage levels that can be stored in the memory cells and M is greater than 2.

8. The method of claim 1, wherein jointly determining the read reference voltages and the programming voltages comprises determining optimal values for the read reference voltages while holding the programming voltages fixed.

9. The method of claim 1, wherein jointly determining the read reference voltages and the programming voltages comprises determining optimal values for the programming voltages while holding the read reference voltages fixed.

10. The method of claim 1, wherein determining the optimal values comprises maximizing $I(X;Y)$.

11. The method of claim 1, wherein determining the optimal values comprises determining if a sum of mutual information values for all programming voltages is maximum.

12. An apparatus, comprising:
   a controller configured to control a memory, the controller configured to
   jointly determine, using a mutual information function, $I(X;Y)$, optimal values that achieve predetermined bit error rate criteria for one or more of programming voltages used to program memory cells of the memory and read reference voltages used to read the memory cells, where X represents data values programmed to the memory cells and Y represents data values read from the memory cells in the function $I(X;Y)$, wherein the optimal values for one of the read reference voltages and programming voltages are determined while holding the other of the read reference voltages and programming voltages fixed, and
   generate signals to control adjustment of at least one of the read reference voltages and the programming voltages to the optimal values.

13. The apparatus of claim 12, wherein the controller is configured to determine the optimal values for multipage memory architecture.

14. The apparatus of claim 12, wherein the controller is configured to determine the optimal values for full sequence memory architecture.

15. The apparatus of claim 12, wherein the controller is configured to determine the optimal values by maximizing $I(X;Y)$.

16. The apparatus of claim 12, wherein the controller is configured to determine if a sum of mutual information values for all programming voltages is maximum without constraint that the mutual information values for all programming voltages are equal.

17. The apparatus of claim 12, wherein the controller is configured to estimate noise used in determining the mutual information using asymmetrical noise distributions.

* * * * *